(12) United States Patent
Atkinson

(10) Patent No.: US 6,542,042 B1
(45) Date of Patent: Apr. 1, 2003

(54) LOW POWER CRYSTAL OSCILLATOR WITH FEEDBACK RESISTOR PAIR

(75) Inventor: Simon Atkinson, Heathfield (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/789,251

(22) Filed: Feb. 20, 2001

(51) Int. Cl.[7] ................................................ H03B 5/36
(52) U.S. Cl. ............................ 331/116 R; 331/108 C; 331/158
(58) Field of Search .................... 331/108 C, 116 R, 331/116 FE, 158

(56) References Cited

U.S. PATENT DOCUMENTS

| | | | |
|---|---|---|---|
| 4,028,638 A | 6/1977 | Towle | |
| 4,228,405 A | * 10/1980 | Rhoads | 331/65 |
| 4,560,955 A | 12/1985 | Sauer | |
| 4,571,558 A | * 2/1986 | Gay et al. | 331/105 |
| 4,600,899 A | 7/1986 | Kennedy | |
| 5,416,448 A | 5/1995 | Wessendorf | |
| 6,169,459 B1 | 1/2001 | Wessendorf | |

* cited by examiner

Primary Examiner—David C. Mis
(74) Attorney, Agent, or Firm—Samuels, Gauthier & Stevens, LLP

(57) ABSTRACT

A crystal oscillator circuit is disclosed including a differential amplifier, a positive feedback assembly, and a series resonant crystal assembly. The differential amplifier includes a first transistor and a second transistor. The positive feedback assembly is coupled to each of the first and second transistors, and has a loop gain of greater than unity. The series resonant crystal assembly is coupled to one of the first and second transistors, and includes a crystal and a capacitor.

12 Claims, 3 Drawing Sheets

LOW POWER CRYSTAL OSCILLATOR WITH FEEDBACK RESISTOR PAIR

BACKGROUND OF THE INVENTION

The invention relates to the field of crystal oscillators, and relates in particular to the field of low power crystal oscillators.

There is an increasing need for a growing number of types of circuits to be designed to operate on battery power. Battery power and battery life, however, are typically limiting factors in the performance of a battery power circuit. Moreover, as battery power circuits become more complex they may require more power and/or performance life. There is a growing need, therefore, for crystal oscillators to require as little of the power as necessary, preserving much of the battery power for the remaining elements of the circuit.

There is also a continuous need for such circuits to be as small as possible and to have as few external connections as possible, given the increasing demand for including a growing number of circuit elements to be included in as little circuit and/or integrated circuit real estate as possible.

Further, as wireless communication systems (e.g., radio frequency telecommunication systems) have become increasingly popular, a demand has developed for less expensive yet efficient crystal oscillators. Such oscillators may be used with any of a plurality of standards for radio frequency modulation in wireless communication devices, such as global systems for mobile communication (GSM), which operate at 900 MHz. or digital cellular systems (DCS), which operate at 1800 MHz.

There is a need, therefore, for a low power crystal oscillator that requires a small amount of area on an integrated circuit and as few external connections on the integrated circuit as possible. It is further desirable to provide a low power crystal oscillator that requires only one external connection on an integrated circuit in addition to the source voltage and ground.

SUMMARY OF THE INVENTION

The invention provides a crystal oscillator circuit including a differential amplifier, a positive feedback assembly, and a series resonant crystal assembly. The differential amplifier includes a first transistor and a second transistor. The positive feedback assembly is coupled each of the first and second transistors, and has a loop gain of greater than unity. The series resonant crystal assembly is coupled to one of the first and second transistors, and includes a crystal and a capacitor.

BRIEF DESCRIPTION OF THE DRAWING

The following description may be further understood with reference to the accompanying drawing in which.

DETAILED DESCRIPTION OF THE INVENTION

Figure 1:
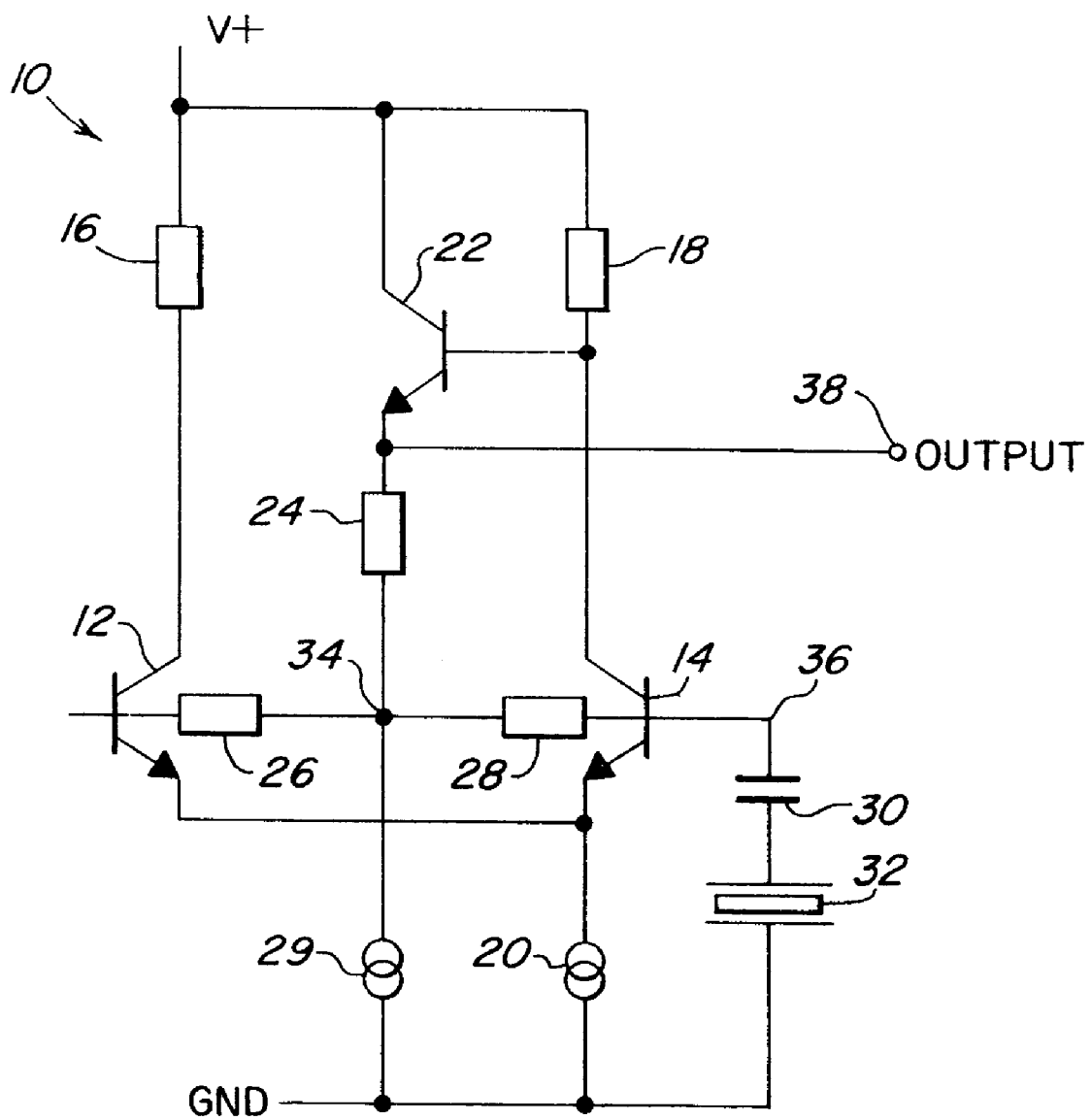
FIGS. 1–3 show illustrative schematic representations of various embodiments of the invention.

As shown in FIG. 1, a crystal oscillator circuit 10 of an embodiment of the invention includes a differential amplifier that is formed by two transistors 12 and 14, load resistors 16 and 18, and a biasing current source 20. The circuit also includes a feedback network that is formed by transistor 22, resistors 24, 26 and 28, and current source 29, as well as a resonant circuit that is formed by capacitor 30 and a crystal 32. The crystal 32 is a high Q crystal that is connected between the capacitor 30 and ground.

As shown in FIG. 1, during operation, the circuit produces an oscillating signal at the output port 38. The combination of the crystal 32 and the load capacitance of the capacitor 30 becomes series resonant, and the voltage at node 36 approximates to a virtual earth. Because of the high impedance at the base of transistor 12, the voltage at the base of transistor 12 follows the voltage at the node 34. As a consequence, the differential voltage applied across the differential amplifier formed by transistors 12 and 14 and load resistors 16 and 18, is equal to the voltage at node 34. With appropriately chosen component values, a loop gain of greater than unity with positive feedback phase will be achieved, thus defining the condition for oscillation.

If the crystal 32 were not present in the circuit of FIG. 1, the signal voltage at node 34 is applied equally to the bases of transistors 12 and 14. Because the impedance between the node 36 and ground is very high compared with the resistance of resistor 28, no differential voltage appears across the inputs of the differential amplifier formed by transistors and 12 and 14 and load resistors 16 and 18. The loop gain, therefore, is less than one (or unity) ensuring a non-oscillating condition.

If the crystal 32 has an effective series resistance of $R_{ESR}$ and the trans-resistance of transistor 22 is small compared with the resistance of resistor 24 ($R_1$), then the condition for oscillation is where:

$$G(R_2+R_{ESR})[1-(G \times R_{ESR}/(R_1+R_2+[G+1] \times R_{ESR}))]/(R_1+R_2+R_{ESR}) \geq 1$$

where G is the open loop gain of the differential amplifier, $R_1$ is the resistance of resistor 24, and $R_2$ is the resistance of each of the resistors 26 and 28. In the oscillating condition, the output may be taken off the emitter of transistor 22 at the output port 38 as shown in FIG. 1.

Figure 2:
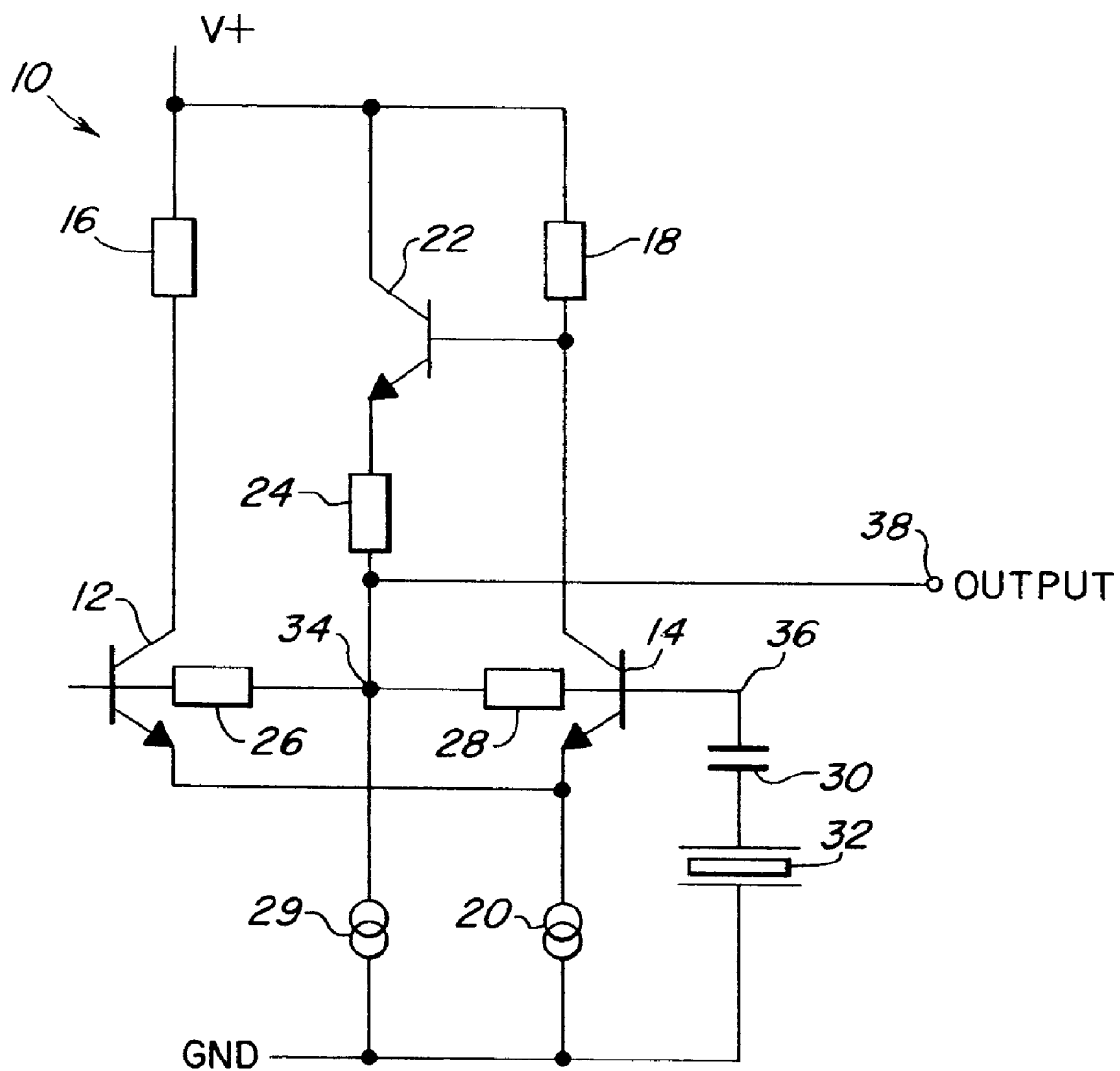
Figure 3:
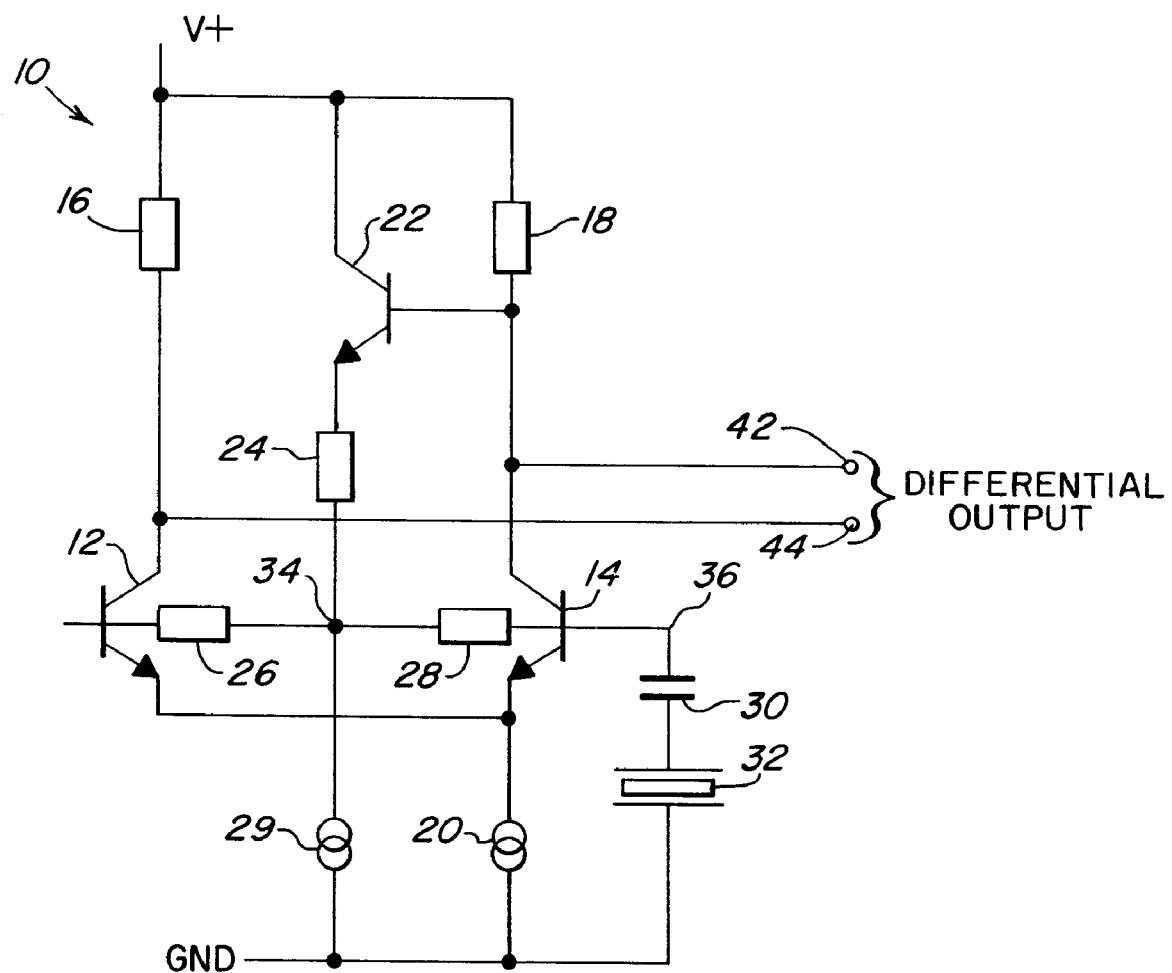

If an oscillating output signal of a lower amplitude is desired, the output signal may be obtained from output port 40 as shown in FIG. 2. If differential output signals are desired, then a pair of 180 degree mutually phase output signals may be obtained from ports 42 and 44 as shown in FIG. 3. The invention further provides that various output signals may be used internally in an integrated circuit while providing one output signal only at a single pin connector on the integrated circuit. For example, an integrated circuit may utilize the differential output signals internally, and include an output pin that provides an output signal at port 38 as shown in FIG. 1.

Those skilled in the art will appreciate that numerous modifications and variations may be made to the above embodiments without departing from the spirit and scope of the invention. For example, PNP transistors may be used in place of the NPN transistors by reversing the polarity of the circuit.

What is claimed is:

1. A crystal oscillator circuit comprising:
    a differential amplifier including a first transistor and a second transistor;
    a positive feedback assembly coupled to each of said first and second transistors, said positive feedback assembly providing a loop gain of greater than unity and including a pair of resistors, each of which is coupled to one of said first and second transistors of said differential amplifier; and
    a series resonant crystal assembly coupled to one of said first and second transistors, said series resonant crystal assembly including a crystal and a capacitor.

2. A crystal oscillator circuit comprising:

a differential amplifier including a first transistor and a second transistor;

a positive feedback assembly coupled to the bases of each of said first and second transistors, said positive feedback assembly providing a loop gain of greater than unity and including a pair of feedback resistors, each of which is coupled to a base of one of said first and second transistors of said differential amplifier; and a series resonant crystal assembly coupled to the base of one of said first and second transistors, said series resonant crystal assembly including a crystal and a capacitor.

3. The crystal oscillator circuit as claimed in claim 2, wherein said differential amplifier further includes first and second load resistors, each of which is coupled to a collector of one of said first and second transistors respectively.

4. The crystal oscillator circuit as claimed in claim 2, wherein said differential amplifier further includes a first current source that is commonly coupled to the emitters of said first and second transistors.

5. The crystal oscillator circuit as claimed in claim 2, wherein said positive feedback assembly further includes a third transistor that is coupled at its emitter to said differential amplifier.

6. The crystal oscillator circuit as claimed in claim 5, wherein said positive feedback assembly further includes a third feedback resistor that is coupled to an emitter of said third transistor.

7. The crystal oscillator as claimed in claim 6, wherein said positive feedback assembly further includes a second current source that is coupled to said third feedback resistor.

8. The crystal oscillator circuit as claimed in claim 6, wherein said pair of feedback resistors are further coupled to said third feedback resistor.

9. The crystal oscillator circuit as claimed in claim 2, where the capacitor of said series resonant crystal assembly is coupled at one end to the base of one of said first or second transistors of said differential amplifier, and is coupled at the other end of the capacitor to the crystal.

10. A crystal oscillator circuit as claimed in claim 2, wherein said circuit is included in an integrated circuit that provides a single output port at a single pin on the integrated circuit.

11. A crystal oscillator circuit as claimed in claim 2, wherein said circuit is included in an integrated circuit that provides differential output signals internally within the integrated circuit.

12. A crystal oscillator circuit comprising:

a differential amplifier including a first transistor and a second transistor, a first resistor that is coupled to the collector of said first transistor, and a first current source that is coupled to the emitter of said first transistor;

a positive feedback assembly coupled to the bases of each of said first and second transistors, said positive feedback assembly including a pair of feedback resistors, each of said feedback resistors being coupled to a base of one of said first and second transistors of said differential amplifier for and a third transistor providing a loop gain of greater than unity; and a series resonant crystal assembly coupled to the base of said first transistor, said series resonant crystal assembly including a crystal and a capacitor.

* * * * *